United States Patent
Shin

(10) Patent No.: US 6,526,080 B1
(45) Date of Patent: Feb. 25, 2003

(54) BIDIRECTIONAL LIGHT TRANSMITTING AND RECEIVING DEVICE

(75) Inventor: Hyun-kuk Shin, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/614,878

(22) Filed: Jul. 12, 2000

(30) Foreign Application Priority Data

Jul. 12, 1999 (KR) .............................. 99-27989

(51) Int. Cl.⁷ ................................. H01S 5/00
(52) U.S. Cl. ............................ 372/45; 372/45; 372/43; 372/44; 372/46; 372/47; 372/48; 372/49; 372/50; 372/99
(58) Field of Search ............................ 372/45, 99, 102, 372/43, 44, 46, 47, 48, 49, 50; 385/88–93

(56) References Cited

U.S. PATENT DOCUMENTS

| | | | |
|---|---|---|---|
| 5,285,466 A | 2/1994 | Tabatabaie | 372/50 |
| 5,334,854 A * | 8/1994 | Ono et al. | 257/13 |
| 5,475,701 A | 12/1995 | Hibbs-Brenner | 372/50 |
| 5,557,693 A | 9/1996 | Stevens et al. | 385/24 |
| 5,566,265 A * | 10/1996 | Spaeth et al. | 385/93 |
| 5,574,814 A | 11/1996 | Noddings et al. | 385/90 |
| 5,757,836 A | 5/1998 | Jiang et al. | 372/50 |
| 5,757,837 A | 5/1998 | Lim et al. | 372/43 |
| 5,799,030 A | 8/1998 | Brenner | 372/50 |
| 5,874,730 A | 2/1999 | Yi et al. | 250/225 |
| 5,898,722 A | 4/1999 | Ramdani et al. | 372/23 |
| 5,914,976 A | 6/1999 | Jayaraman et al. | 372/50 |
| 5,963,576 A | 10/1999 | Claisse et al. | 372/45 |
| 5,974,071 A | 10/1999 | Jiang et al. | 372/50 |
| 5,978,401 A | 11/1999 | Morgan | 372/50 |
| 6,001,664 A * | 12/1999 | Swirhun et al. | 372/45 |
| 6,026,111 A | 2/2000 | Jiang et al. | 372/101 |
| 6,069,908 A | 5/2000 | Yuen et al. | 372/96 |
| 6,081,638 A | 6/2000 | Zhou | 372/108 |
| 6,084,900 A | 7/2000 | Claisse et al. | 372/23 |
| 6,229,712 B1 * | 5/2001 | Munoz-Bustamante et al. | 174/260 |

* cited by examiner

*Primary Examiner*—Paul Ip
*Assistant Examiner*—Delma R. Flores Ruiz
(74) *Attorney, Agent, or Firm*—Robert E. Bushnell, Esq.

(57) ABSTRACT

A bidirectional light transmitting and receiving device includes a first light transceiver having a first light emitter and a first light receiver for receiving a light beam entering around the first light emitter, and a second light transceiver having a second light emitter and a second light receiver for receiving a light beam entering around the second light emitter, and signal transmission and reception between the corresponding first and second light device units is achieved through the same optical passageway. The bidirectional light transmitting and receiving device has a simple configuration because optical signal transmission and reception are achieved through the single optical passageway. The number of optical fibers required for the signal transmission and reception in the device is reduced by half, and thus the manufacturing cost also becomes lower.

21 Claims, 8 Drawing Sheets

BIDIRECTIONAL LIGHT TRANSMITTING AND RECEIVING DEVICE

CLAIM OF PRIORITY

This application makes reference to, incorporates the same herein, and claims all benefits accruing under 35 U.S.C. §119 from my application BIDIRECTIONAL LIGHT TRANSMITTING AND RECEIVING DEVICE filed with the Korean Industrial Property Office on Jul. 12, 2000 and there duly assigned Serial No. 27989/1999.

BACKGROUND OF THE INVENTION

1. Field of the Invention

The present invention relates to a bidirectional light transmitting and emitting device, and more particularly, to a bidirectional light transmitting and emitting device having a light emitter emitting an optical signal onto another receiver and a light receiver receiving the optical signal transmitted from another light emitter, both light emitter and receiver integrated on a substrate.

2. Description of the Related Art

A light transceiver has been used for emitting an optical data signal to be transmitted or receiving an optical data signal transmitted. A light emitter emitting the optical data signal is mounted on the light transceiver and spaced apart from a light receiver receiving the optical data signal. For example, in a conventional light transmitting and receiving device shown in FIG. 1, a first optical signal emitted from a light emitter 3 of a first light transceiver 1 is detected by a light receiver 7 of a second light transceiver 5 while a second optical signal emitted from a light emitter 8 of the second light transceiver 5 is detected by a light receiver 4 of the first light transceiver 1. Optical fibers 2 are disposed between the first and second transceivers 1, 5 to transmit the respective first and second optical signals and form transmission passageways between the light emitters 3, 8, and the light receivers 4, 7, respectively. A condensing lens 6 is attached to each end of optical fibers 2 for improved light transmission efficiency. First light transceiver 1 includes a driver 13 driving light emitter 3 in response to an input data signal, and an amplifier 14 amplifying a first current signal detected by receiver 4. Second light transceiver 5 includes a driver 18 driving light emitter 8 in response to another input data signal, and an amplifier 17 amplifying a second current signal detected by receiver 7.

In the conventional light transmitting and receiving device, an edge emitting laser or a light emitting diode is used for light emitter 3, 8. The light emitted from light emitter 3 is an optical signal appropriately modulated from a data signal to be transmitted. The optical signal is transferred through one end of optical fiber 2, detected by receiver 7, converted into a current signal, and then demodulated into an original data signal by amplifier 17. The light emitted from the light emitter 8, which is also an optical signal appropriately modulated from another data signal, is transmitted 8 to first light transceiver 1 in the same manner as described above.

The conventional light transmitting and receiving device, however, needs two channels for transmission and reception of the optic signals. The structure of the device is complicated because of the increased number of parts. The manufacturing process of the conventional light transmitting and receiving device is difficult. Moreover, these problems become more serious since a plurality of the light transmitting and receiving devices are assembled for multi-channel data transmission requiring more transmission and reception channels.

SUMMARY OF THE INVENTION

It is an object of the present invention to provide a light transmitting and receiving device able to transmit one signal and receive another signal through a single channel.

It is another object to provide a light transmitting and receiving device able to connect one of light transmitting and receiving device to another light transmitting and receiving device through a clear path.

It is yet another object to provide a light transmitting and receiving device able to reduce the number of optic fiber cables connected between light transmitting and receiving devices.

It is still another object to provide a light transmitting and receiving device able to reduce the size of a light emitter and a lighter receiver.

It is a further object to provide a light transmitting and receiving device able to reduce a manufacturing cost by integrally forming a light emitter and a light receiver on a single substrate and reducing the number of the optic fiber cables.

It is also an object to provide a light transmitting and receiving device able to precisely and accurately detecting an optical signal by using a relatively high absorbency with respect to a particular wavelength of light.

These and other objects may be achieved by providing a light transmitting and receiving device including a first light transceiver having at least one first light device unit having a first vertical cavity surface emitting laser (VCSEL) portion generating and emitting a light beam in the stack direction of semiconductor material layers, a first light receiving portion combined with the first VCSEL portion receiving an incident beam entering around the first VCSEL portion, and a first driver for driving the first VCSEL portion, a second light transceiver having at least one second light device unit having a second VCSEL portion generating and emitting a light beam in the stack direction of semiconductor material layers, a second light receiving portion combined with the second VCSEL receiving an incident beam entering around the second VCSEL portion, a second driver for driving the second VCSEL portion, wherein a signal transmission and reception between the corresponding, first and second light device units is performed through the same passageway.

Each of the first and second VCSEL portions includes a substrate, a lower electrode formed over the back side of the substrate, a subreflector, an active layer and an upper reflector formed over the substrate in sequence, and an upper electrode formed at the top edge of the upper reflector. The first and second light receiving portions share the substrate and the lower electrode with a corresponding combined VCSEL portion and includes a first semiconductor material layer formed on the substrate to surround the combined VCSEL portion, a predetermined distance apart from the combined VCSEL portion, a second semiconductor material layer and a third semiconductor material layer formed over the first semiconductor material layer in sequence, and a detecting electrode formed on the top edge of the third semiconductor material layer.

The bidirectional light transmitting and receiving device includes a common layer between the substrate and the VCSEL portion and the light receiving portions in at least one of first and second light device units. The common layer is formed of the same material and with the same number of layers as the subreflector. The first semiconductor material layer is formed of the same material and with the same number of layers as the subreflector. The second semiconductor material layer is formed of the same material to have the same thickness as the active layer, and the third. semiconductor material layer is formed of the same material and with the same number of layers as the upperreflector.

The bidirectional light transmitting and receiving device includes at least one optical fiber cable arranged on the optical passageway between the corresponding first and second light device units to transmit an optical signal, wherein the signal transmission and reception between the corresponding first and second light device units is performed through the optical fiber cable.

The bidirectional light transmitting and receiving device includes a first light transceiver including a first printed circuit board (PCB) and at least one first light device unit mounted on the first PCB, the first light device unit including a first light emitter for emitting a light beam in an approximately vertical direction to the first PCB and a first light receiver for receiving a light beam entering around the first light emitter, a second light transceiver including a second PCB and at least one second light device unit mounted on the second PCB, the second light device unit having a second light emitter for emitting a light beam in an approximately vertical direction to the second PCB and a second light receiver for receiving a light beam entering around the second light emitter, and at least one optical fiber cable arranged between the corresponding first and second light device units to transmit an optical signal, wherein a signal transmission and reception between the corresponding first and second light device units is performed through the single optical fiber cable.

BRIEF DESCRIPTION OF THE DRAWINGS

A more complete appreciation of the invention, and many of the attendant advantages, thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
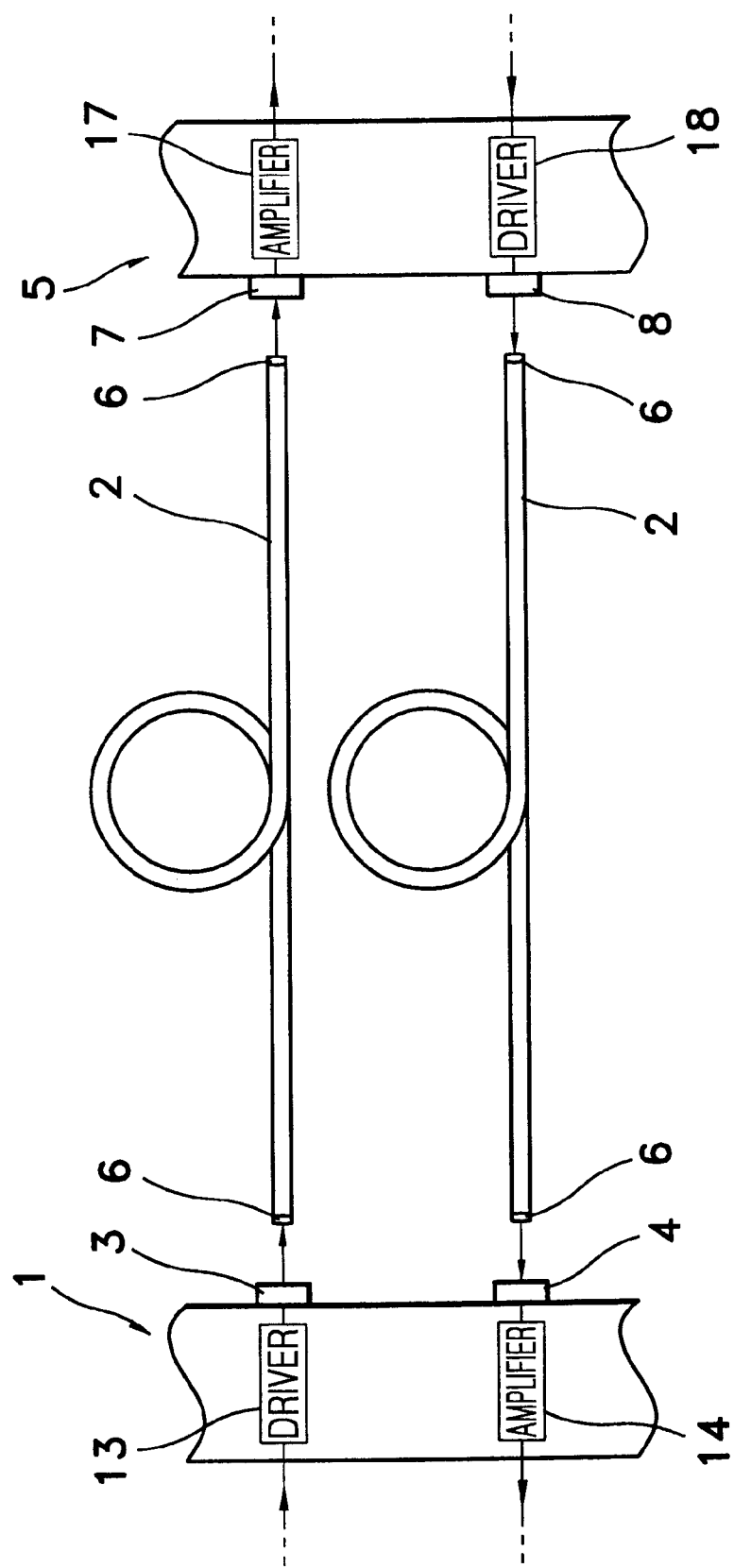
FIG. 1 is a schematic view of a conventional light transmitting and receiving device.
Figure 2:
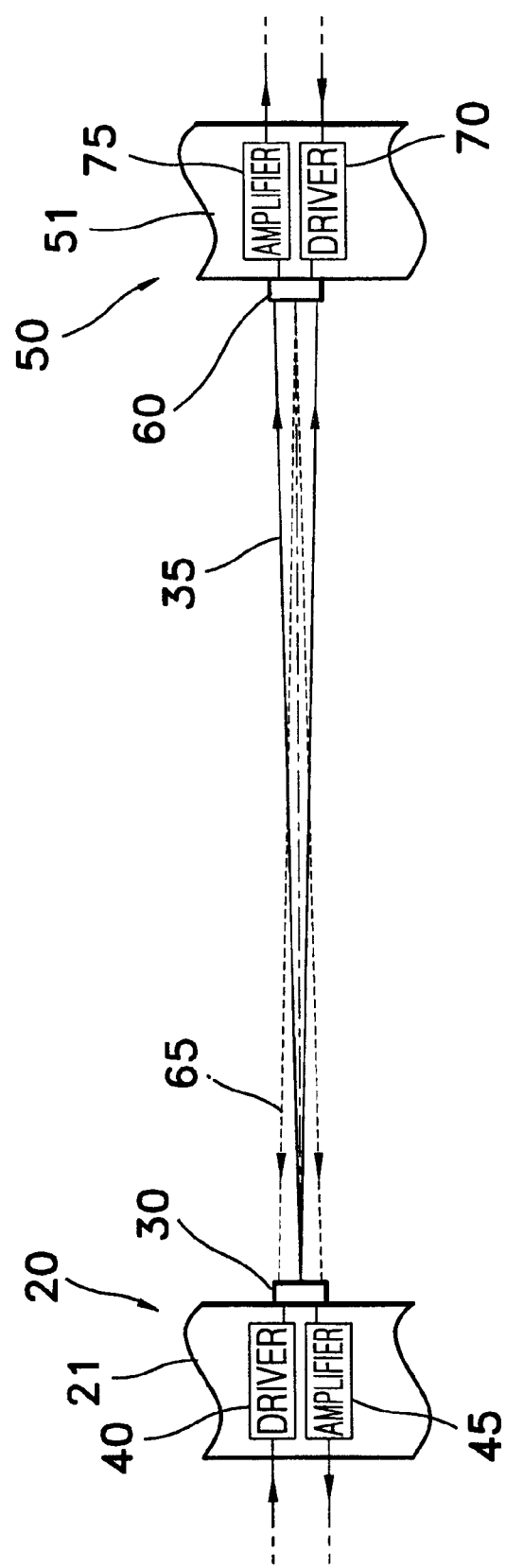
FIG. 2 is a schematic view of a bidirectional light transmitting and receiving device having a light device unit according to the principle of the present invention.

Referring now to FIG. 2, a bidirectional light transmitting and receiving device includes a first light transceiver 20 and a second light transceiver 50 both corresponding to each other. First light transceiver 20 includes a light device unit 30 mounted on a base 21, such as printed circuit board, a driver 40 driving light device unit 30 to allow an optical signal to be output from light device unit 30, and an amplifier 45 amplifying the signal detected by the light device unit 30. In a similar manner, second light transceiver 50 includes a light device unit 60 mounted on a base 51, a driver 70 driving light device unit 60 to allow an optical signal to be output from light device unit 60, and an amplifier 75 amplifying the signal detected by light device unit 60. The reference numeral 35 represents a first optical signal modulated from an input electrical signal and emitted from light device unit 30 onto light device unit 60 while reference numeral 65 represents a second optical signal modulated from another input electrical signal and emitted from light device unit 60 onto light device unit 30.

Figure 3:
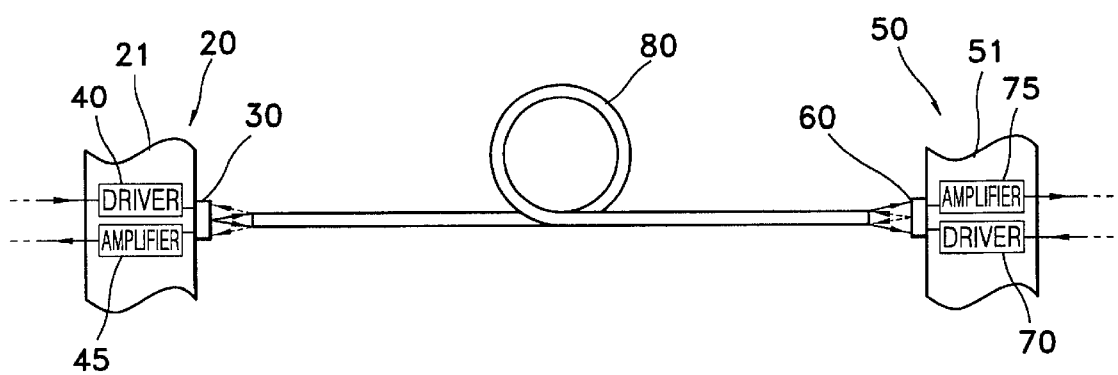
FIG. 3 is a schematic view showing an optical fiber cable connected to the bidirectional light transmitting and receiving device of FIG. 2.

Since first light transceiver 20 and second light transceiver 50 are disposed to face each other as shown in FIG. 2, the transmission and reception of the optical signals between first and second light transceivers 20,50 can be achieved through a clear space. Alternatively, an optical fiber cable 80 is disposed between first and second light transceivers 20,50 for the optical signal transmission and reception as shown in FIG. 3.

Figure 4:
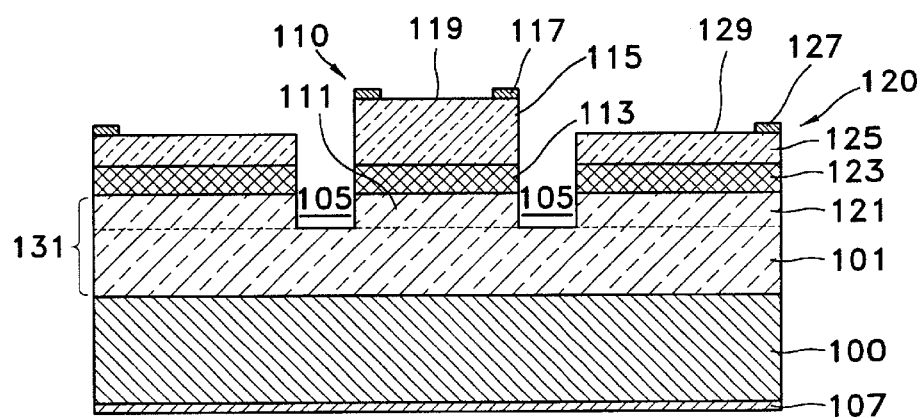
FIG. 4 is a cross-sectional view of the light device unit according to the principle of the present invention.

FIG. 4 illustrates the light device unit including a vertical cavity surface emitting laser (VCSEL) portion 110 generating and emitting a laser in a stacked direction of semiconductor material layers, and a light receiving portion 120 formed around the VCSEL portion 110. VCSEL portion 110 and light receiving portion 120 are formed on the same substrate 100 and share a lower electrode 107 formed on a back side of the substrate 100. VCSEL portion 110 and light receiving portion 120 have a common layer 101 over substrate 100.

VCSEL portion 110 includes a subreflector 111 formed on a central portion of common layer 101, an active layer 113 formed over subreflector 111, an upper reflector 115 formed over active layer 113, and an upper electrode 117 formed on upper reflector 115 with a predetermined pattern. Light receiving portion 120 includes a first, a second, and a third semiconductor material layers 121, 123 and 125, which are sequentially stacked on common layer 101 around VCSEL portion 110, and a detecting electrode 127 formed over the third semiconductor material layers 125. Preferably, for the purpose of guiding current of VCSEL portion 110, a guide portion is formed on each sides of active layer 113 and a portion of upper reflector 115 by performing ion implantation or oxidation with respect to active layer 113 and the portion of upper reflector 115.

In VCSEL portion 110, the substrate 100 is any one of an undoped intrinsic semiconductor substrate or a doped semiconductor substrate. Preferably, each of subreflector 111, upper reflector 115, and common layer 101 is a stack of layers formed by alternately stacking semiconductor compound layers. Common layer 101 and subreflector 111 form a lower reflector 131. Reflective index varies depending on the number of semiconductor compound layers stacked. Thus, it is preferable that the number of stacked layers of upper reflector 115 is smaller than the number of stacked layers of lower reflector 131 having a low reflectivity compared to upper reflector 115. A large portion of the laser generated from VCSEL portion emits through upper reflector 115. Substrate 100 may be doped with n-type, and common layer 101 and subreflector 111 may be doped with n-type while upper reflector 115 is doped with p-type.

Upper electrode 117 is formed on a portion of upper reflector 115. Light emits exclusively through a window 119. As a forward biased current is applied between upper and lower electrodes 117, 107, the current flows through active layer 113, and light is generated by combination of holes and electrons in active layer 113. Only a portion of the generated light having a wavelength in accordance with a resonance condition between lower and upper reflectors 131 and 115 is amplified and emitted through window 113. An optical signal modulated by driver 40, 70 of FIG. 3 in accordance with data to be transmitted is output.

In light receiving portion 120, a first semiconductor material layer 121 is formed by alternately stacking the same semiconductor compound layers as subreflector 111 by a number of times equal to subreflector 111. First semiconductor material layer 121 and common layer 101 form a lower reflector 131 and have a high reflectivity. Second semiconductor material layer 123 is formed of the same intrinsic semiconductor material as used for active layer 113 and have approximately the same thickness as that of active layer 113. Third semiconductor material layer 125 is formed by alternately stacking, the same semiconductor compound layers as upper reflector 115 by a number of times less than upper reflector 115. Third semiconductor material layer 125 has a relatively low reflectivity and thus transmits a large portion of the light incident to a photo-receiving surface 129.

When substrate 100, subreflector 111, and upper reflector 115 of VCSEL portion 110 are doped with n-type, n-type and p-type, respectively, first semiconductor material layer 121 is doped with n-type, second semiconductor material layer 123 is formed of intrinsic semiconductor material layer, and third semiconductor material layer 125 doped with p-type, thereby light receiving portion 120 serving as a PIN-type photodetector.

Figure 5:
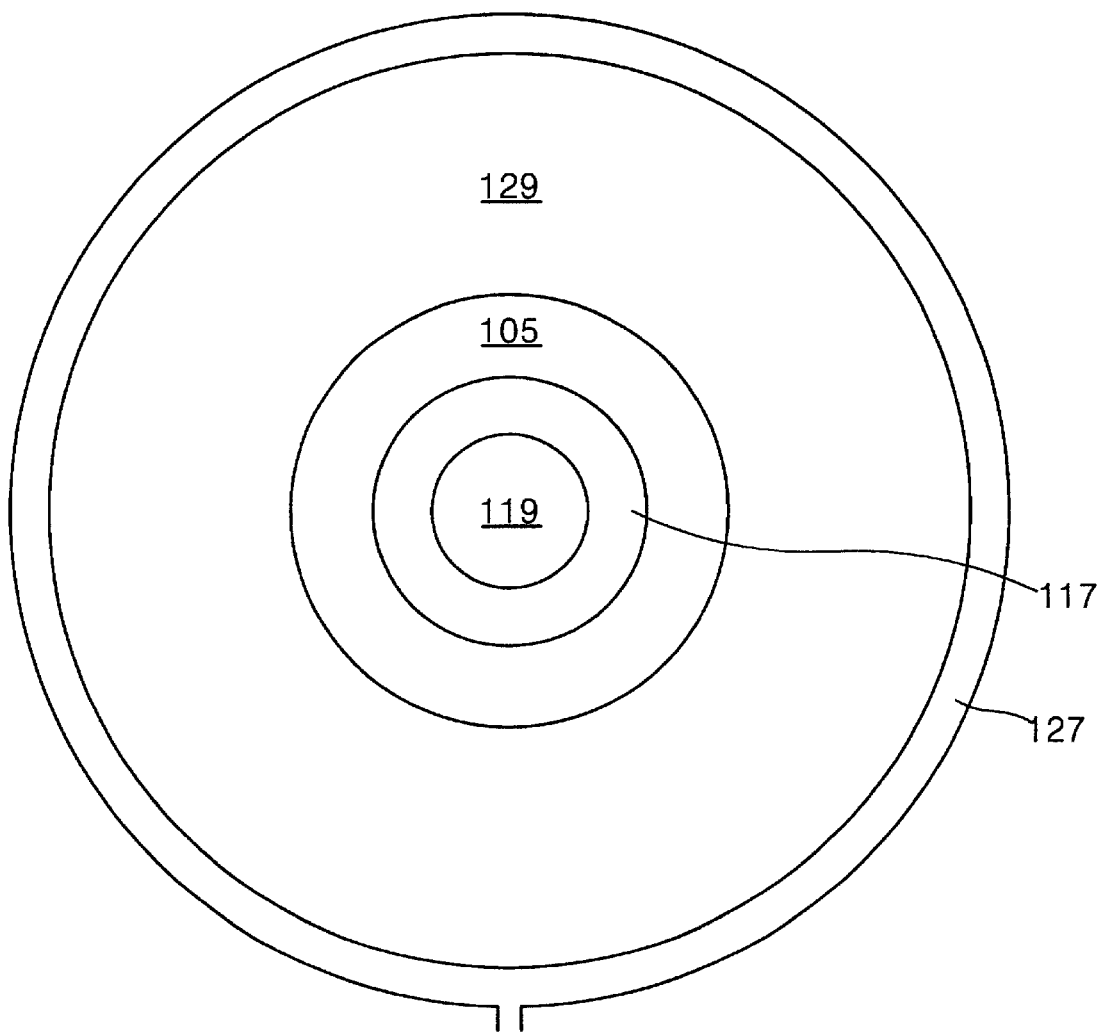
FIG. 5 is a plan view of the light device unit of FIG. 4.

Detecting electrode 127 is formed at a top edge of third semiconductor material layer 125. Light is concurrently incident to VCSEL portion 110 and light receiving portion 120. An area of photo-receiving surface 129 is larger than a top area of VCSEL portion 110 as shown in FIG. 5. Most of the incident light enters photo-receiving surface 129 and is detected by light receiving portion 120. Thus, most of the light entering light device unit 30,60 is received by photo-receiving surface 129 and passes through third semiconductor material layer 125. A portion of light passing through third semiconductor material layer 125 is absorbed by second semiconductor material layer 123. which is relatively thin and has a low reflectivity. The other portion of the light transmitted through second semiconductor material layer 123 is reflected from lower reflector 131 having a relatively high reflectivity toward second semiconductor material layer 123. A portion of the light reflected from lower reflector 131 is absorbed by second semiconductor material layer 123, and the other portion of the light transmitted through second semiconductor material layer 123 goes toward third semiconductor material layer 125. A portion of the light passed through second semiconductor material layer 123 is reflected from third semiconductor material layer 125 to second semiconductor material layer 123. The light incident into photo-receiving surface 129 is absorbed by first, second, and third semiconductor material layer 12, 123, 125 through a series of reflection. Although second semiconductor material layer 123 of light receiving portion 120 is relatively thin like the active layer 113, most of the incident light can be absorbed by light receiving portion 120.

Lower reflector 131 and third semiconductor material layer 125 have a relatively high reflectivity for reflecting the light having a wavelength in accordance with the resonance condition, and thus light receiving portion 120 having relatively high absorbency with respect to the wavelength can select a particular wavelength from the light received. Thus, the optical signal is detected by the above mentioned light device unit of the bidirectional light transmitting and receiving device according to the principle of the present invention.

VCSEL portion 110 and light receiving portion 120 are electrically separated from each other by a trench 105 formed on the top of common layer 101 and between VCSEL portion 110 and light receiving portion 120. Alternatively, an ion implantation layer or an oxide layer may be provided between VCSEL portion 110 and light receiving portion 120 for electrical separation.

The light device unit having the above configuration may be formed as follows. Firstly, lower reflector 131 including common layer 101 and subreflector layer 111, active layer 113, and upper reflector 115 are stacked in sequence over substrate 100. Secondly, the periphery region of VCSEL portion 111 is etched to a top portion of the common layer 101 to form trench 105 isolating VCSEL portion 110 from light receiving portion 120. Thirdly, upper reflector 115 of light receiving portion 120 is etched until 1 or up to 5 stacked layers remain so that upper reflector 115 and third semiconductor material layer 125 have a relatively low reflectivity, and then VCSEL portion 110 and light receiving portion 120 are formed.

Because VCSEL portion has the same stacked structure of the semiconductor layers as the light receiving portion, the light device unit having VCSEL portion and light receiving portion can be simply formed and manufactured by performing a deposition and etching process and a electrode pattern forming process after stacking the semiconductor layers.

The optical signal is transmitted and received in the bidirectional light transmitting and receiving device having the light device unit shown in FIG. 4 as follows. When the optical signal is transferred from first light transceiver 20 to second light transceiver 50 as shown in FIGS. 2 and 3, driver 40 drives VCSEL portion 110 of first light transceiver 20 in response to an input electrical signal. A first optical signal 35 modulated from the input electrical signal is emitted form light device unit 30. First optical signal 35 is incident to light device unit 60 of second light transceiver 50. A large portion of the incident light absorbed by light receiving portion 120 is converted into an electrical signal and then demodulated into the original input electrical signal by amplifier 75. A signal transmitted from second light transceiver 70 to first light transceiver 20 is performed in the same manner as described above.

In the present embodiment of the bidirectional light transmitting and receiving device, a signal is transmitted through the clear path or the optical fiber cable 80 between first light transceiver 20 and second light transceiver 50. The transmission and reception of an optical signal is performed through a single channel, and thus the number of required channels reduces by half compared to the conventional light transmission and reception device. VCSEL portion 10 emits an approximately circular beam, and optical coupling efficiency with optical fiber cable 80 can be enhanced without need for any coupling means.

Figure 6:
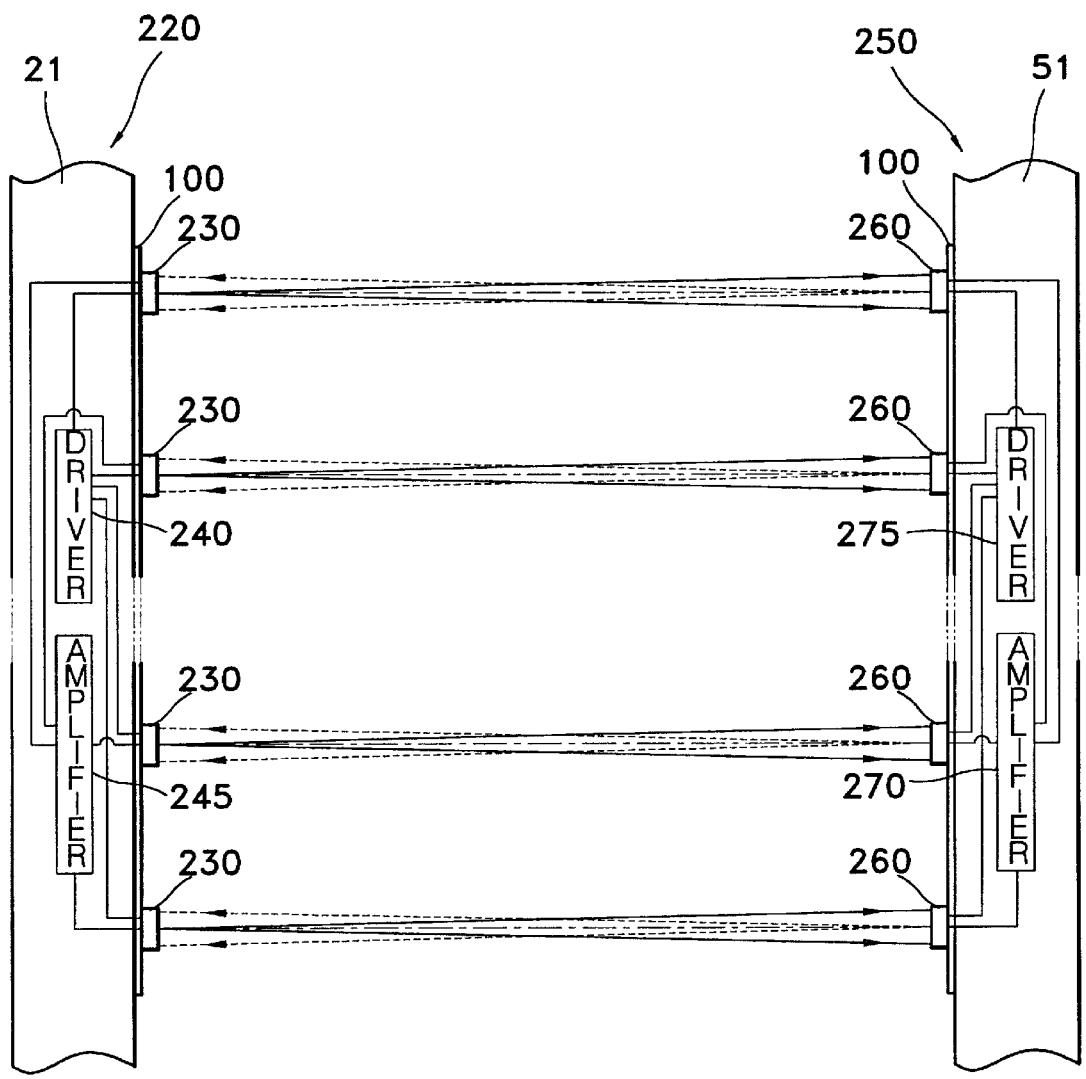
FIG. 6 is a schematic view illustrating one embodiment of the bidirectional light transmitting and receiving device according to the present invention.

FIG. 6 illustrates a second embodiment of the bidirectional light transmitting and receiving device according to the present invention. In the second embodiment, a plurality of channels for an optical signal transmission are provided between a first light transceiver 220 and a second light transceiver 250. First light transceiver 220 includes a plurality of first light device units 230, and second light transceiver 250 includes a plurality of second light device units 260, wherein each one of first light device units 230 corresponds to each of second light device units 260. First light transceiver 220 includes a driver 240 and an amplifier 245, and second light transceiver 250 includes a driver 270 and an amplifier 275. Drivers 240 and 270 selectively drive VCSEL portion 110 of first light device units 230 and second light device units 260. Also, amplifiers 245 and 275 amplify the optical signals detected by light receiving portions 120 of first light device units 230 and second light device units 260 and generate an electrical signal which is demodulated into the original electrical signals.

Preferably, both the plurality of the first light device units 230 and the plurality of the second light device units 260 are formed in an array form. The plurality of the first light device units 230 are electrically isolated from each other and are independently operated by forming at least a trench at a portion of the semiconductor material layers between the light device units. This separation technique can be applied to the plurality of second light device units 230. In addition, the trenches may be filled with polyimide. The configuration of both first and second light device units 230 and 260 are the same as in the first embodiment described with reference to FIGS. 4 and 5. Alternatively, first light device units 230 and second light device units 260 can be mounted on the bases 21 and 52 in an array, respectively.

Figure 7:
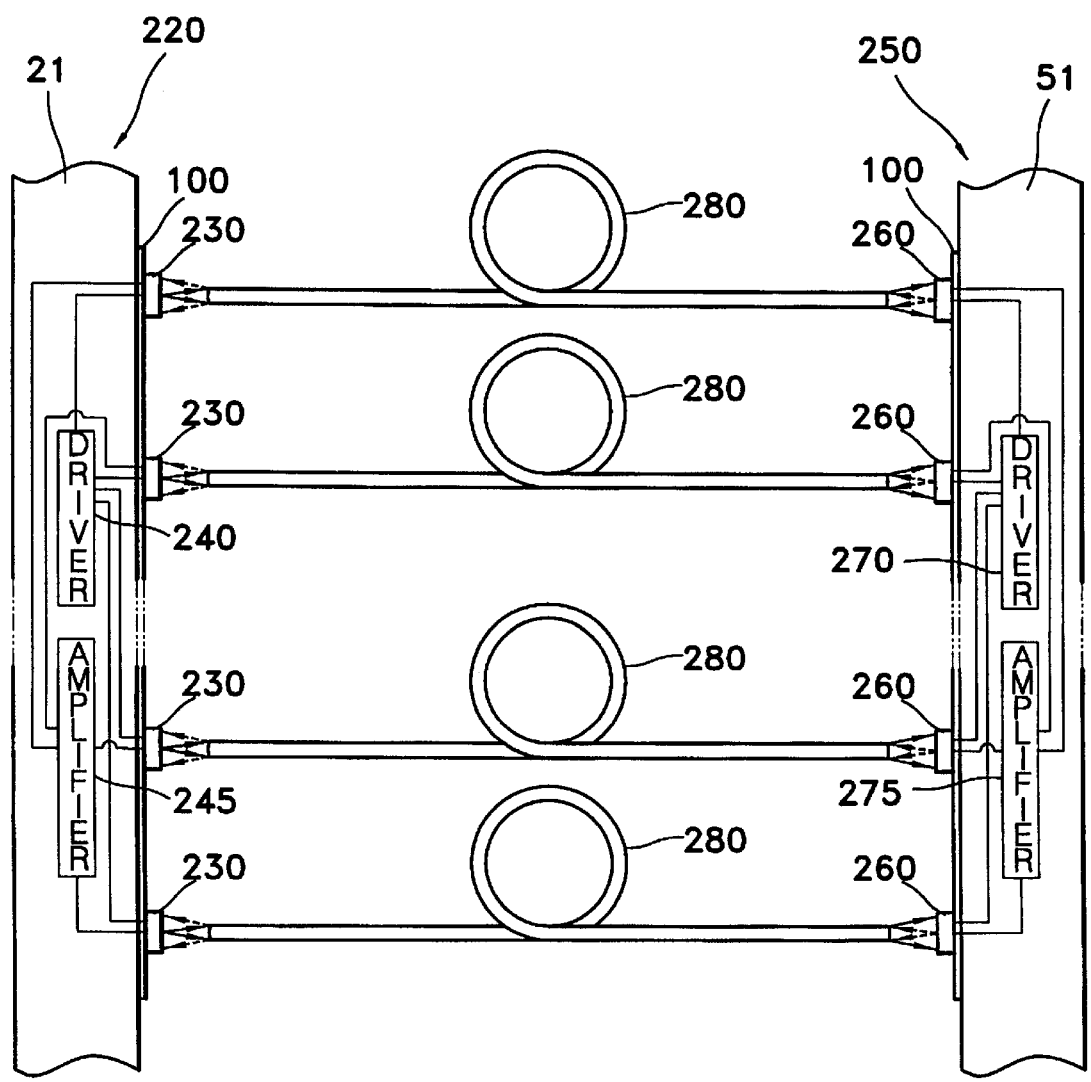
FIG. 7 is a schematic view illustrating a plurality of optical fiber cables connected to the bidirectional light transmitting and receiving device of FIG. 6.

In FIG. 6, optical signal transmission between first light transceiver 220, and the second light transceiver 250 is achieved through a clear path. Alternatively, an optical signal can be transmitted through optical fiber cables 280 between first light transceivers 220 and second light transceivers 250 as shown in FIG. 7. If a multi-channel signal transmission between first light transceiver 220 and second light transceiver 250 is achieved through the optical fiber cables 280, first light transceiver 220 can be arranged in a location remote from second light transceiver 250. A detailed optical signal transmission in the bidirectional light transmitting and receiving device is the same as the previously mentioned first embodiment as shown in FIGS. 4 and 5.

First light device unit 30 and second light device unit 60 of the first embodiment shown in FIGS. 2 and 3, and First light device units 230 and second light device units 260 of the second embodiment shown in FIGS. 6 and 7 may include a VCSEL emitting an optical signal and a light 8 receiver disposed to receive light being incident around the VCSEL in order to form separate light elements. This configuration of the light device unit can be shown in the following embodiments. VCSEL may be formed on the light receiver to allow the light receiver to receive the light entering around the VCSEL, through a photo-receiving surface of the light receiver. In this case, a base may be further interposed between the VCSEL and the light receiver. As another example, the VCSEL and the light receiver may be installed on the same base while VCSEL is surrounded by the light receiver a predetermined distance spaced-apart from each other.

Figure 8:
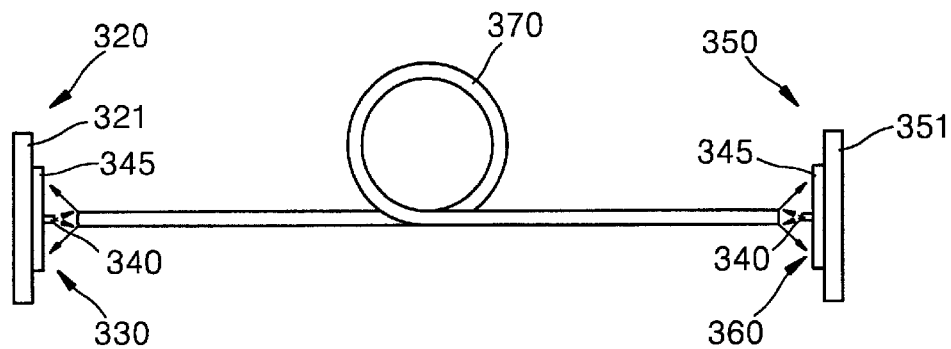
FIGS. 8 through 10 are schematic views showing the other embodiments of the bidirectional light transmitting and receiving device according to the present invention.
Figure 9:
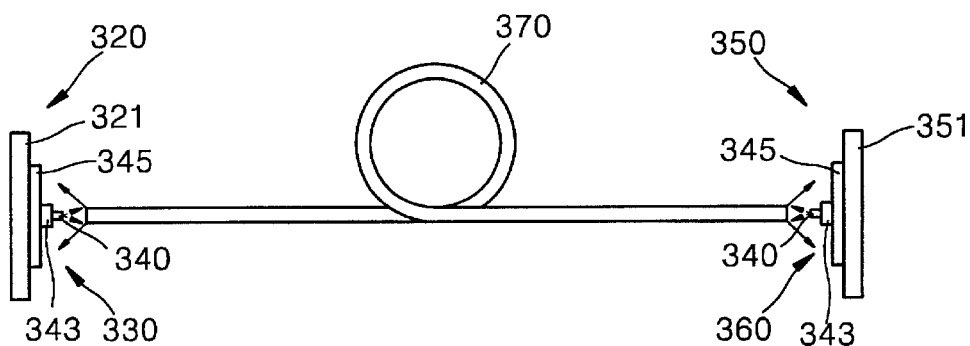
Figure 10:
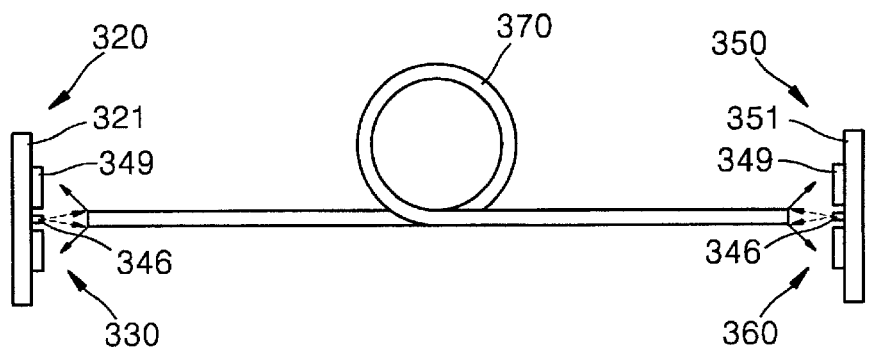

FIGS. 8 through 10 illustrate another embodiment of the bidirectional light transmitting and receiving device according to the present invention. A first light transceiver 320 includes a first printed circuit board (PCB) 321 and a first light device unit 330 mounted on the first PCB 321. A second light transceiver 350 includes a second PCB 351 and a second light device unit 360 mounted on the second PCB 351. Also, an optical fiber cable 370 is arranged between first light device unit 330 of first light transceiver 320 and second light device unit 360 of second light transceiver 350 so that a signal transmission and reception between first and second light device units 330, 360 is achieved through single optical fiber 370.

FIG. 8 illustrates a configuration of first and second light device units 330, 360, in which light emitters 340 are installed on a light receivers 345, such that light receivers 345 are able to receive the light entering around light emitters 340. In this case, light emitters 340 emit light approximately in the vertical direction to first and second PCBs 321 and 351. FIG. 9 illustrates another configuration of first and second light device units 330, 360, in which a base 343 is further arranged between the light emitter 340 and the light receiver 345 of each of first and second light device units 330, 360. Bases 343 may be a PCB. FIG. 10 illustrates still another configuration of the first and second light device units 330 and 360. A light emitter 346 and a light receiver 349 of first light device unit 330 are mounted on the same first PCB 321. Also, light emitter 346 and light receiver 349 of second light device unit 360 are mounted on the same second PCB 351. Here, light emitter 346 is surrounded by light receiver 349 with a predetermined distance therebetween.

In FIGS. 8 through 10, light emitters 340, 346 include one of VCSEL, LED and edge laser diode LD. Light receivers 345, 349 include a common photo-diode. Alternatively, light receivers 345 and 349 may adopt a configuration which is the same or similar to light receiving portion 120 of FIG. 4. In first and second PCBs 321 and 351, a driver driving light emitters 340, 346, and an amplifier amplifying the signal detected by light receivers 345 and 349 and demodulating the input optical signal into the original electrical signal are further installed.

Figure 11A:
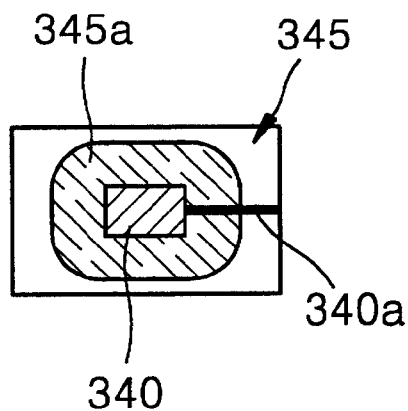
FIGS. 11A and 11B are plan views of the light device unit of FIG. 8.
Figure 11B:
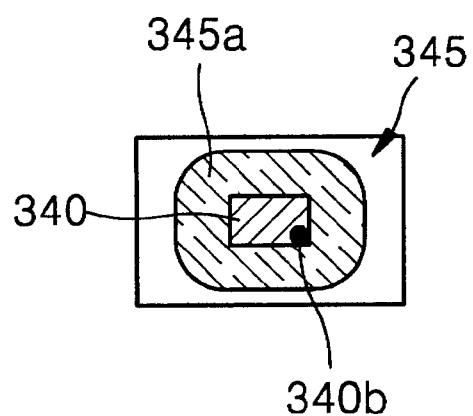

When light emitter 340, such as a VCSEL, is mounted on light receiver 345, and a ground electrode is formed at the bottom of light emitter 340, a ground electrode pattern 340a of light emitter 340 is formed at a portion of photo-receiving surface 345a of light receiver 345 as shown in FIG. 11A. On the other hand, when a ground electrode 340b of light emitter 340 is formed on a top portion of light emitter 340 as shown in. FIG. 11B, an additional ground electrode pattern is not needed on the light receiver 345. In this case, a ground electrode 340b of light emitter is wirebonded to an external ground.

The bidirectional light transmitting and receiving devices shown in FIGS. 8 through 10 may be constructed to include a plurality of first and second light device units 330, 360 in the first and second PCBs 321 and 351, respectively, in an array, and to connect each one of first light device units 330 to corresponding on of second light device units 330 with optical fiber cables 370, which enables a multi-channel signal transmission and reception as illustrated in FIGS. 6 and 7. An optical signal transmission between the first light transmitter and emitter 320 and the second light transmitter and emitter 350 illustrated in FIGS. 8 and 10 is the same as in the previously mentioned embodiments.

In the bidirectional light transmitting and receiving device according to the present invention, the transmission and reception of an optical signal is achieved through the same passageway with simplified configuration. In addition, as for the case of adopting an optical fiber cable for the transmission of optical signal, the optical signal can be received and transmitted through a single optical fiber cable, and thus the number of optical fiber cables that are required for signal transmission can be half-reduced compared to a conventional light transmitting and receiving device. Thus, the bidirectional light transmitting and receiving device can be easily manufactured with reduced cost. A low-priced optical bus can be implemented with the bidirectional light transmitting and receiving device according to the present invention, which enables a high-speed signal transmission between local area devices.

When the light receiver of an light device unit has a similar stack structure to the VCSEL, the light receiver shows a relatively high absorbency with respect to a particular wavelength of light, so that an optical signal can be accurately detected without being greatly affected by background emission.

While this invention has been particularly shown and described with reference to preferred embodiments thereof, it will be understood by those skilled in the art that various changes in form and details may be made thereto without departing from the spirit and scope of the invention as defined by the appended claims.

What is claimed is:

1. A bidirectional light transmitting and receiving device, comprising:

at least one first light transceiver including a first light device unit having a first light emitter and a first light receiver both integrally formed on a first substrate, said first light receiver surrounding said first light emitter;

at least one second light transceiver spaced apart from said at least one first light transceiver, and including a second light device unit having a second light emitter and a second light receiver both integrally formed on a second substrate, said second light receiver surrounding said second light emitter;

said second light receiver being disposed to receive a first optical signal emitted from said first light emitter through a first clear path, and said first light receiver being disposed to receive a second optical signal emitted from said second light emitter through a second clear path; and a single common passageway disposed between said at least one first light transceiver and said at least one second light transceiver to provide said first clear path and said second clear path.

2. The device of claim 1, said first light emitter comprising a first vertical cavity surface emitting laser having a plurality of semiconductor layers, and said first light receiver comprising a plurality of semiconductor layers, a number of the semiconductor layers of said first light receiver being equal to a number of the semiconductor layers of said first vertical cavity surface emitting laser.

3. The device of claim 1, further comprising an optic cable disposed between said at least one first light transceiver and said at least one second light transceiver and spaced apart from said at least one first light transceiver and said at least one second light transceiver to receive and transfer both said first optical signal and said second optical signal.

4. The device of claim 1, wherein:

said at least one first light transceiver comprises a plurality of first light transceivers and said at least one second light transceiver comprises a plurality of second light transceivers, each one of said second light transceivers corresponding to a respective one of said first light transceivers;

each one of said first light transceivers including a first light device unit having a first light emitter and a first light receiver both integrally formed on a first substrate;

each one of said second light transceivers including a second light device unit having a second light emitter and a second light receiver both integrally formed on a second substrate;

each of said second light receivers being disposed to receive said first optical signal emitted from a corresponding one of said first light emitters through a respective one of a plurality of first clear paths, and each one of said first light receivers being disposed to receive said second optical signal emitted from a corresponding one of said second light emitters through a respective one of a plurality of second clear paths; and said device further comprising a plurality of common passageways disposed between said first light transceivers and said second light transceivers, each of said common passageways providing both one of said first clear paths and one of said second clear paths.

5. The device of claim 4, wherein a number of said passageways is equal to a number of said first light emitters of said first light transceivers and a number of said second light emitters of said second light transceivers.

6. The device of claim 4, further comprising a plurality of optic cables disposed between said first light transceivers and said second light transceivers and spaced apart from said first light transceivers and said second light transceivers, each of said optic cables receiving and transferring said first optical signal and said second optical signal.

7. A bidirectional light transmitting and receiving device, comprising:

a first light transceiver including at least one first light device unit having a first vertical cavity surface emitting laser (VCSEL) generating and emitting a first light beam in a direction of first stacked semiconductor material layers, a first light receiving portion surrounding said first VCSEL and receiving an incident beam entering around said first VCSEL, and a first driver for driving said first VCSEL; and a second light transceiver including at least one second light device unit having a second VCSEL generating and emitting a second light beam in a second direction of second stacked semiconductor material layers, a second light receiving portion surrounding said second VCSEL and receiving an incident beam entering around said second VCSEL, and a second driver driving said second VCSEL;

wherein both signal transmission and signal reception between corresponding first and second light device units are performed through a single passageway.

8. The device of claim 7, each of said first VCSEL and said second VCSEL comprising:

a substrate;

a lower electrode formed over a bottom of said substrate;

a subreflector, an active layer and an upper reflector, each formed over said substrate in sequence; and an upper electrode formed at a top edge of said upper reflector;

each of said first and second light receiving portions being monolithically integrated with said first and second VCSELs, respectively, on a first substrate and a second substrate, respectively, and including:

a first semiconductor material layer formed on the substrate and surrounding said VCSEL, and spaced apart from said VCSEL by a predetermined distance;

a second semiconductor material layer and a third semiconductor material layer, each formed over said first semiconductor material layer in sequence; and a detecting electrode formed on a top edge of said third semiconductor material layer.

9. The device of claim 8, further comprising a common layer disposed between said substrate, on one side, and said VCSEL and said light receiving portion, on another side, said common layer and said substrate being formed of a same material, and said common layer having a predetermined number of layers forming said subreflector.

10. The device of claim 8, wherein said first semiconductor material layer is formed of a same material and with a same number of layers as said subreflector, said second semiconductor material layer is formed of a same material and with a same thickness as the active layer, and said third semiconductor material layer is formed of a same material and with a same number of layers as the upper reflector.

11. The device of claim 7, wherein said VCSEL and said light receiving portion of one of said first and second light device units are formed into separate light elements, said VCSEL of said one of said first and second light device units emitting a given light beam and being disposed on said light receiving portion of said one of said first and second light device units receiving another light beam.

12. The device of claim 11 wherein one of said first and second light device units further comprises a base between said VCSEL and said light receiving portion.

13. The device of claim 7, wherein each of said VCSEL and said light receiving portion of at least one of said first and second light device units is formed into separate light elements, and said VCSEL is installed so as to be surrounded by said light receiving portion on a common base.

14. The device of claim 7, further comprising at least one optical fiber cable arranged on said single passageway between the corresponding first and second light device units to transmit an optical signal, wherein the signal transmission and the signal reception between the corresponding first and second light device units is performed through a single optical fiber cable.

15. A bidirectional light transmitting and receiving device, comprising:
    a first light transceiver including a first printed circuit board (PCB) and at least one first light device unit mounted on said first PCB, said first light device unit having a first light emitter emitting a first light beam and a first light receiver formed around said first light emitter to receive a second light beam entering around said first light emitter;
    a second light transceiver including a second PCB and at least one second light device unit mounted on the second PCB, said second light device unit having a second light emitter emitting said second light beam and a second light receiver formed around said second light emitter to receive said first light beam entering around said second light emitter; and
    a single optical fiber disposed between said first and second light device units for transmitting said first light beam and said second light beam;
    wherein signal transmission and reception between said first and second light device units are performed through said single optical fiber.

16. The device of claim 15, said first and second light beams being emitted in a perpendicular direction relative to said first PCB and second PCB, respectively.

17. The device of claim 15, said first light emitter and said second light emitter being monolithically integrated with said first light receiver and said second light receiver, respectively.

18. The device of claim 17, said first and second light device units each including a base between said first and second light emitters, respectively, and said first and second light receivers, respectively.

19. The device of claim 15, said first and second light emitters being disposed so as to be surrounded by said first and second light receivers, respectively, on said first PCB and said second PCB, respectively.

20. A light transmitting and receiving device, comprising:
    a first light transceiver having a first light emitter and a first light receiver both formed on a first substrate, said first light emitter emitting a first optical signal through a single path, said first light receiver surrounding said first light emitter and being disposed to receive a second optical signal through said single path;
    a second light transceiver having a second light emitter and a second light receiver both formed on a second substrate, said second light emitter emitting said second optical signal through said signal path, said second light receiver surrounding said second light emitter and being disposed to receive said first optical signal emitted from said first light emitter through said single path; and
    a single fiber having an end disposed adjacent to said first light transceiver and another end disposed adjacent to said second transceiver so as to provide said single path.

21. A light transmitting and receiving device, comprising:
    a first light transceiver including a first light emitter and a first light receiver;
    a second light transceiver including a second light emitter and a second light receiver, said second light transceiver being spaced apart from said first light transceiver; and
    a single common passageway disposed between said first light transceiver and said second light transceiver, said second light receiver being disposed to receive a first optical signal emitted from said first light emitter through said single common passageway, and said first light receiver being disposed to receive a second optical signal emitted from said second light emitter through said single common passageway;
    wherein said first light receiver surrounds said first light emitter, and said second light receiver surrounds said second light emitter.

* * * * *